(12) United States Patent
Kim et al.

(10) Patent No.: US 9,059,345 B2
(45) Date of Patent: Jun. 16, 2015

(54) SOLAR CELL USING P-I-N NANOWIRE

(75) Inventors: Tae-Whan Kim, Seoul (KR); Joo-Hyung You, Seoul (KR); Jae-Hun Jung, Seoul (KR); Jae-Seok Yi, Anyang-si (KR); Won-Il Park, Seoul (KR)

(73) Assignee: INDUSTRY-UNIVERSITY COOPERATION FOUNDATION, HANYANG UNIVERSITY, Seoul (KR)

( * ) Notice: Subject to any disclaimer, the term of this patent is extended or adjusted under 35 U.S.C. 154(b) by 833 days.

(21) Appl. No.: 13/382,134

(22) PCT Filed: Jul. 6, 2010

(86) PCT No.: PCT/KR2010/004395
§ 371 (c)(1),
(2), (4) Date: Jan. 3, 2012

(87) PCT Pub. No.: WO2011/005013
PCT Pub. Date: Jan. 13, 2011

(65) Prior Publication Data
US 2012/0097232 A1    Apr. 26, 2012

(30) Foreign Application Priority Data
Jul. 6, 2009  (KR) .................. 10-2009-0061182

(51) Int. Cl.
*H01L 31/0352* (2006.01)

(52) U.S. Cl.
CPC .. *H01L 31/03529* (2013.01); *H01L 31/035281* (2013.01); *Y02E 10/50* (2013.01)

(58) Field of Classification Search
CPC ................ H01L 31/00; H01L 31/0352; H01L 31/035281; H01L 31/03529
See application file for complete search history.

(56) References Cited

U.S. PATENT DOCUMENTS

| 2004/0118448 A1* | 6/2004 | Scher et al. ............... 136/252 |
| 2008/0169019 A1 | 7/2008 | Korevaar et al. |

FOREIGN PATENT DOCUMENTS

| JP | 2007-027625 A | 2/2007 |
| KR | 100809248 B1 | 2/2008 |
| KR | 2009-0003840 A | 1/2009 |

* cited by examiner

*Primary Examiner* — Christina Chern
(74) *Attorney, Agent, or Firm* — William Park & Associates Ltd.

(57) ABSTRACT

A solar cell using a p-i-n nanowire that may generate light by absorbing solar light in a wide wavelength region efficiently without generating light loss and may be manufactured with a simplified process and low cost. The solar cell includes: a semiconductor layer formed of a semiconductor material; and a photoelectromotive layer including a semiconductor structure including a core-nanowire that extends long in an upward direction of the semiconductor layer and is formed of an intrinsic semiconductor material, and a shell-nanowire that is formed to surround a periphery of the core-nanowire and is formed of a semiconductor material, wherein the semiconductor material that is used for forming the semiconductor layer includes an n-type semiconductor material, or the semiconductor material that is used for forming the shell-nanowire includes a p-type semiconductor material, and the semiconductor material that is used for forming the semiconductor layer includes a p-type semiconductor material, and the semiconductor material that is used for forming the shell-nanowire includes an n-type semiconductor material.

17 Claims, 9 Drawing Sheets

SOLAR CELL USING P-I-N NANOWIRE

TECHNICAL FIELD

The present invention relates to a high efficiency solar cell, and more particularly, to a solar cell using a p-i-n nanowire.

BACKGROUND ART

As global environment problems occur, fossil energy is exhausted and problems relating to disposal of waste in nuclear power generation and determination of sites of new power generation plants occur, new renewable energy has drawn attention, and research and development of generation of solar light that is a pollution-free energy source among new renewable energy have been briskly conducted in domestic and foreign countries.

Solar cells are optical devices that receive light energy from incident light and convert light energy into electrical energy by using a photoelectromotive force. Research for improving light generation efficiency and research for reducing manufacturing cost have been conducted. In order to improve light generation efficiency, tandem type solar cells that absorb solar light having a long wavelength and solar light having a short wavelength efficiently have been widely studied. In addition, in order to reduce manufacturing cost, organic-inorganic composite materials that are used in existing silicon-based solar cells have been widely studied.

Tandem type solar cells that absorb solar light in a wide wavelength region efficiently can overcome a limitation in light generation efficiency of solar cells having a single energy bandgap. However, due to characteristics of a device that is called a stacked multilayered structure, losses of light generation efficiency occur when solar light is transmitted through a thin layer. The greatest loss among the losses is a loss of defects caused by lattice mismatch that occurs in a tunnel junction portion between heterojunction thin layers and crystalline defects of thin layers. In particular, when a photoelectric conversion layer is formed in a lower portion of a solar cell, the amount of transmitted light energy is reduced, and thus light generation efficiency is rapidly lowered. In addition, since semiconductor thin layers having good crystallinity should be stacked in a multilayered structure in order to reduce light loss, an epitaxial deposition method with high processing cost and a long processing time needs to be used. For this reason, manufacturing cost increases so as to absorb solar light in a wide wavelength region efficiently, and a limitation in light generation efficiency occurs.

In order to reduce manufacturing cost of tandem type solar cells, solar cells using organic-inorganic composite materials have been also studied. However, tandem type tandem type solar cells using organic-inorganic composite materials can use inexpensive organic materials, but light loss occurs between stacked thin layers, and light generation efficiency is rapidly lowered due to defects of organic thin layers and defects between organic and inorganic thin layers.

Thus, a new concept of solar cells that may reduce manufacturing cost and simultaneously may prevent light generation efficiency from being rapidly lowered due to light loss, are required.

DETAILED DESCRIPTION OF THE INVENTION

Technical Problem

The present invention provides a solar cell using a p-i-n nanowire that may generate light by absorbing solar light in a wide wavelength region efficiently without generating light loss and may be manufactured with a simplified process and low cost.

Technical Solution

According to an aspect of the present invention, a solar cell includes: a semiconductor layer formed of a semiconductor material; and a photoelectromotive layer including a semiconductor structure including a core-nanowire that extends long in an upward direction of the semiconductor layer and is formed of an intrinsic semiconductor material, and a shell-nanowire that is formed to surround a periphery of the core-nanowire and is formed of a semiconductor material, wherein the semiconductor material that is used for forming the semiconductor layer includes an n-type semiconductor material, and the semiconductor material that is used for forming the shell-nanowire includes a p-type semiconductor material, or the semiconductor material that is used for forming the semiconductor layer includes a p-type semiconductor material, and the semiconductor material that is used for forming the shell-nanowire includes an n-type semiconductor material.

The photoelectromotive layer may further include an organic structure including conductive polymer that is deposited on the semiconductor layer to surround a lateral portion of the semiconductor structure. The organic structure may further include at least one of a nanoparticle that is dispersed into the conductive polymer and a carbon nanotube (CNT) including the nanoparticle dispersed into the conductive polymer, attached to the carbon nanotube (CNT).

Advantageous Effects

A solar cell according to the present invention uses a nanowire that is vertically grown in a p-i-n structure, as a photoelectromotive layer so that a cross-sectional area for absorbing light efficiently increases. Since an electric field in a depletion region increases, movement of electrons and holes is improved, and a ratio of recombining electrons and holes is reduced, and thus light generation efficiency is improved. In addition, since the solar cell according to the present invention uses an inorganic material and an organic material that are inexpensive, manufacturing cost may be reduced, and a process of manufacturing the solar cell is simplified. A semiconductor structure and an organic structure that absorb light in different wavelength bands are formed perpendicular to and parallel to a substrate so that solar light in a wide wavelength region may be absorbed without generating loss and light generation efficiency may be improved. In addition, a p-i-n nanowire does not reflect incident solar light towards the outside but collects incident solar light and thus, additional texturing is not required.

MODE OF THE INVENTION

The present invention will now be described more fully with reference to the accompanying drawings, in which exemplary embodiments of the invention are shown. The invention may, however, be embodied in many different forms and should not be construed as being limited to the embodiments set forth herein; rather, these embodiments are provided so that this disclosure will be thorough and complete, and will fully convey the concept of the invention to those skilled in the art.

Figure 1:
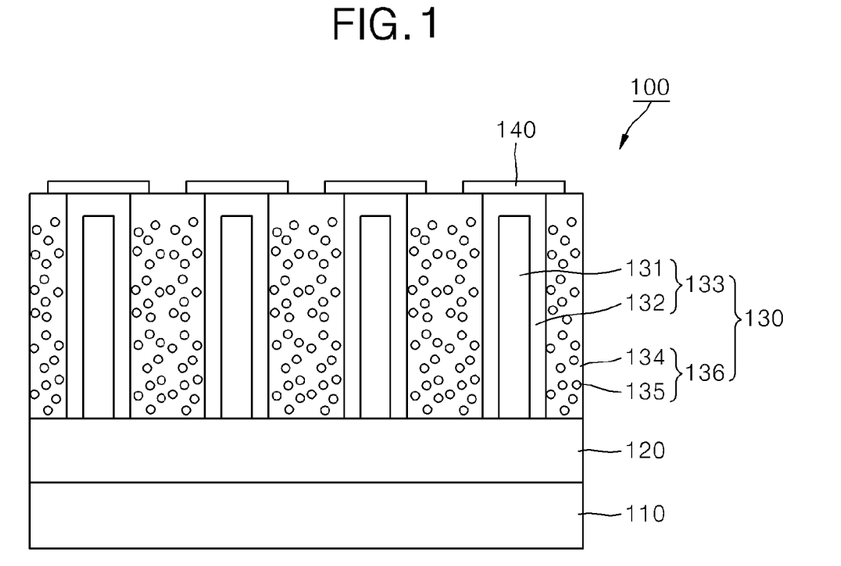
FIG. 1 is a view illustrating a schematic structure of a solar cell according to an embodiment of the present invention.

FIG. 1 is a view illustrating a schematic structure of a solar cell 100 according to an embodiment of the present invention.

Referring to FIG. 1, the solar cell 100 includes a lower electrode 110, a semiconductor layer 120, a photoelectromotive layer 130, and an upper electrode 140.

The lower electrode 110 is formed of a conductive material.

The semiconductor layer 120 is formed on the lower electrode 110 and is formed of a semiconductor material. An n-type or p-type semiconductor material is used for forming the semiconductor layer 120. A semiconductor substrate may be used as the semiconductor layer 120. In this regard, the semiconductor substrate may be formed of an inorganic or organic material. Available inorganic materials for forming the semiconductor substrate may be at least one selected from the group consisting of Si, Ge, GaAs, GaN, GaP, InAs, InP, InSb, CdSe, CdTe, ZnS, $Al_2O_3$, SiC, glass, and quartz. Available organic materials for forming the semiconductor substrate may be at least one selected from the group consisting of PVP, PMMA, PS, PI, and PET. When the semiconductor substrate is highly doped with an n-type or p-type dopant, the semiconductor substrate may also serve as an electrode. In this regard, the lower electrode 110 may not be formed.

The photoelectromotive layer 130 is formed on the semiconductor layer 120 and includes a semiconductor structure 133 and an organic structure 136.

The semiconductor structure 133 is formed on the semiconductor layer 120 and includes a core-nanowire 131 and a shell-nanowire 132. The core-nanowire 131 extends long in an upward direction of the semiconductor layer 120 and is formed of an intrinsic semiconductor material. Available semiconductor materials for forming the core-nanowire 131 may be at least one selected from the group consisting of Si, Ge, GaAs, GaP, AlSb, InP, $In_2Se_3$, $In_2Te_3$, CdS, CdSe, CdTe, ZnSe, ZnTe, $Bi_2S_3$, $Cu_2S$, $MoSe_2$, $WSe_2$, $SiO_x$, $TiO_2$, $Cu_2O$, CuO, GaN, and ZnO. The core-nanowire 131 may be vertically grown on the semiconductor layer 120 by using an anodic aluminum oxide (AAO) nanoplate that is formed by anodization. The core-nanowire 131 may be vertically grown on the semiconductor layer 120 by using a metal catalyst.

The shell-nanowire 132 is formed to surround a periphery of the core-nanowire 131 and is formed of a semiconductor material. Available semiconductor materials for forming the shell-nanowire 132 may be at least one selected from the group consisting of Si, Ge, GaAs, GaP, AlSb, InP, $In_2Se_3$, $In_2Te_3$, CdS, CdSe, CdTe, ZnSe, ZnTe, $Bi_2S_3$, $Cu_2S$, $MoSe_2$, $WSe_2$, $SiO_x$, $TiO_2$, $Cu_2O$, CuO, GaN, and ZnO. In order to form a p-i-n junction structure by using the semiconductor layer 120, the core-nanowire 131, and the shell-nanowire 132, when the semiconductor layer 120 is formed of an n-type semiconductor material, a p-type semiconductor material is used for forming the shell-nanowire 132, and when the semiconductor layer 120 is formed of a p-type semiconductor material, an n-type semiconductor material is used for forming the shell-nanowire 132.

When the p-i-n junction structure having the above shape is used, a depletion region is defined by a length of the core-nanowire 131 formed of an intrinsic semiconductor material so that the depletion region increases and an electric field in the depletion region increases. When the depletion region increases, an area for absorbing solar light increases, and thus light generation efficiency may be increased. When the electric field in the depletion region increases, a ratio of recombining an electron-hole pair that is generated due to solar light is reduced and thus light generation efficiency may be increased. Thus, when the p-i-n junction structure having the above shape is used in light generation, light generation efficiency may be remarkably increased.

The organic structure 136 is formed on the semiconductor layer 120 and includes conductive polymer 134 and a nanoparticle 135. The conductive polymer 134 is formed to surround a lateral portion of the semiconductor structure 133 and may be formed of p-type conductive polymer or n-type conductive polymer. The conductive polymer 134 may be formed of at least one selected from the group consisting of poly (ethylene oxide), polyphosphazene, polyaniline, polypyrrole, polythiophene, poly(p-phenylene), polyacetylene, poly(sulfur nitride), poly(p-phenylenevinylene), and poly(N-vinylcarbazole).

The nanoparticle 135 is dispersed into the conductive polymer 134. The nanoparticle 135 may be formed of at least one selected from the group consisting of $Al_2O_3$, $BaCO_3$, $Bi_2O_3$, $B_2O_3$, $CaCO_3$, $CeO_2$, $Cr_2O_3$, $Fe_2O_3$, $Ga_2O_3$, $In_2O_3$, $Li_2CO_3$, $LiCoO_2$, MgO, $MnCO_3$, $MnO_2$, $Mn_3O_4$, $Nb_2O_5$, PbO, $Sb_2O_3$, $SnO_2$, $SrCO_3$, $Ta_2O_5$, $TiO_2$, $BaTiO_3$, $V_2O_5$, $WO_3$, and $ZrO_2$.

A bandgap of the nanoparticle 135 may be greater than a bandgap of the intrinsic semiconductor material for forming the core-nanowire 131. Thus, the nanoparticle 135 may absorb solar light having a short wavelength, and the semiconductor structure 133 having the core-nanowire 131 may absorb solar light having a long wavelength so that solar light in a wide wavelength band may be absorbed. However, unlike in a general thin layer stack type tandem solar cell that absorbs solar light in a wide wavelength band, when the semiconductor structure 133 and the organic structure 136 have a vertical structure and are arranged at regular intervals, like in the current embodiment, light loss hardly occurs when solar light is transmitted through a thin layer. Since the semiconductor structure 133 that is vertically arranged at regular intervals does not totally reflect incident solar light towards the outside but serves as a kind of texturing of confining incident light in the photoelectromotive layer 130, an additional texturing process does not need to be performed. Since the semiconductor structure 133 and the organic structure 136 are arranged in a vertical structure, a surface area for absorbing solar light increases, and light generation efficiency may be maximized.

As above, the organic structure 136 having the nanoparticle 135 dispersed into the conductive polymer 134 has been described. However, the organic structure 136 may include conductive polymer 134 in which a carbon nanotube (CNT) having a nanoparticle attached to the carbon nanotube (CNT) is dispersed, instead of the nanoparticle 135. The carbon nanotube (CNT) may be at least one selected from the group consisting of a singe wall carbon nanotube (SWCNT), a double wall CNT (DWCNT), a multi-wall CNT (MWCNT), and a carbon nanotube bundle. The nanoparticle attached to the CNT may be at least one selected from the group consisting of $Al_2O_3$, $BaCO_3$, $Bi_2O_3$, $B_2O_3$, $CaCO_3$, $CeO_2$, $Cr_2O_3$, $Fe_2O_3$, $Ga_2O_3$, $In_2O_3$, $Li_2CO_3$, $LiCoO_2$, $MgO$, $MnCO_3$, $MnO_2$, $Mn_3O_4$, $Nb_2O_5$, $PbO$, $Sb_2O_3$, $SnO_2$, $SrCO_3$, $Ta_2O_5$, $TiO_2$, $BaTiO_3$, $V_2O_5$, $WO_3$, and $ZrO_2$. In addition, a bandgap of the nanoparticle attached to the CNT may be greater than a bandgap of the intrinsic semiconductor material for forming the core-nanowire 131, and the effect of the nanoparticle attached to the CNT is similar to the effect described above.

The upper electrode 140 is formed on the photoelectromotive layer 130 and is formed of a conductive material. The upper electrode 140 may be formed to cover the entire top surface of the semiconductor structure 133 and a portion of a top surface of the organic structure 136 together, as illustrated in FIG. 1. The upper electrode 140 may be formed of a conductive material having permeability so that more solar light may be incident on an inside of the photoelectromotive layer 130. To this end, the upper electrode 140 may be formed of at least one selected from the group consisting of graphene, CNT, indium tin oxide (ITO), Al-doped ZnO (AZO), Ga-doped ZnO (GZO), In-doped ZnO (IZO), Au, Pt, and Ti.

Figure 2:
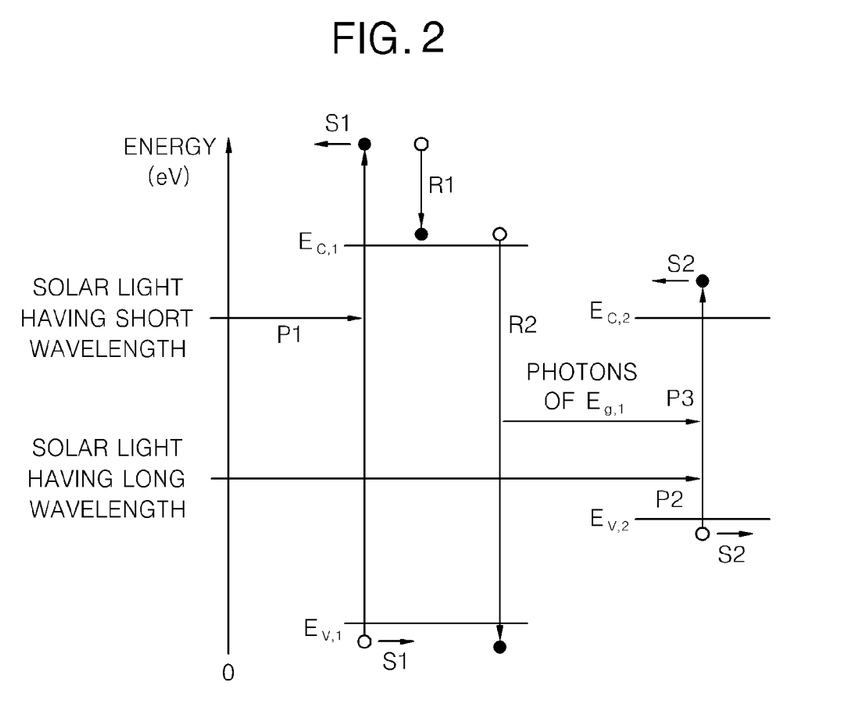
FIG. 2 is a conceptual view for explaining a principle of light generation of the solar cell illustrated in FIG. 1.

FIG. 2 is a conceptual view for explaining a principle of light generation of the solar cell 100 illustrated in FIG. 1. In detail, FIG. 2 is a conceptual view illustrating a case where the semiconductor layer 120 is formed of an n-type semiconductor material, the shell-nanowire 132 is formed of a p-type semiconductor material and a bandgap of the nanoparticle 135 of the organic structure 136 is greater than a bandgap of the intrinsic semiconductor material for forming the core-nanowire 132. An energy level of a valence band of the nanoparticle 135 is indicated by $E_{v,1}$, and an energy level of a conduction band of the nanoparticle 135 is indicated by $E_{c,1}$, and a bandgap of the nanoparticle 135 is indicated by $E_{g,1}$. An energy level of a valence band of the core-nanowire 131 is indicated by $E_{v,2}$, and an energy level of a conduction band of the core-nanowire 131 is indicated by $E_{c,2}$.

Referring to FIG. 2, the most part of solar light that is incident on the solar cell 100 is solar light having a short wavelength in a near ultraviolet (UV) region and solar light having a long wavelength in a visible light region. When solar light is incident on the solar cell 100, solar light having a short wavelength is absorbed by the nanoparticle 135, as marked by P1 of FIG. 2. When the nanoparticle 135 absorbs solar light having a short wavelength, electrons in the valence band of the nanoparticle 135 are excited so that an electron-hole pair is generated. In this case, each of the electrons and holes are moved to an electrode via the conductive polymer 134. However, mobility of the electrons in the organic material is significantly lower than mobility of electrons in the inorganic material. Thus, electrons generated in the nanoparticle 135 are moved to the semiconductor structure 133 and then are moved to the electrode via the semiconductor structure 133.

That is, as marked by S1 of FIG. 2, electrons ● are moved to the lower electrode 110 via the semiconductor structure 133 and the semiconductor layer 120, and holes ○ are moved to the upper electrode 140 via the conductive polymer 134 so that power is generated.

Some of the excited electrons are moved to the lower electrode 110 and the upper electrode 140, do not contribute to power generation, lose energy due to relaxation and are moved to an edge of the conduction band, as marked by R1 of FIG. 2. The electrons that are moved to the edge of the conduction band are recombined with holes in the valence band, as marked by R2 of FIG. 2, so that photons having energy (transition energy) that corresponds to the bandgap $E_{g,1}$ of the nanoparticle 135 are generated.

The photons generated in this way are absorbed by the semiconductor structure 133, as marked by P3 of FIG. 2. Solar light having a long wavelength has energy less than energy corresponding to the bandgap $E_{g,1}$ of the nanoparticle 135 and thus is not absorbed by the nanoparticle 135, is absorbed by the semiconductor structure 133, as marked by P2 of FIG. 2. Due to solar light or photons that are absorbed by the semiconductor structure 133, as marked by P2 and P3 of FIG. 2, electrons in the valance band of the core-nanowire 131 of the semiconductor structure 133 are excited so that an electron-hole pair is generated. In the electron-hole pair generated in this way, as marked by S2 of FIG. 2, electrons ● are moved to the lower electrode 110 via the semiconductor layer 120, and holes ○ are moved to the upper electrode 140 so that power is generated.

As a result, when the bandgap of the nanoparticle 135 is greater than the bandgap of the semiconductor material for forming the core-nanowire 131, solar light having a short wavelength is absorbed by the nanoparticle 135 and is used in light generation, and solar light having a long wavelength is used in light generation by p-i-n junction of the semiconductor structure 133 and the semiconductor layer 120. Thus, solar light in a wide wavelength region may be used in light generation so that light generation efficiency is increased. The depletion region defined by the length of the core-nanowire 131 that corresponds to an intrinsic semiconductor increases, and an electric field in the depletion region increases so that light generation efficiency is increased.

FIGS. 3 through 8 are cross-sectional views illustrating a method of manufacturing a solar cell, according to an embodiment of the present invention.

Figure 3:
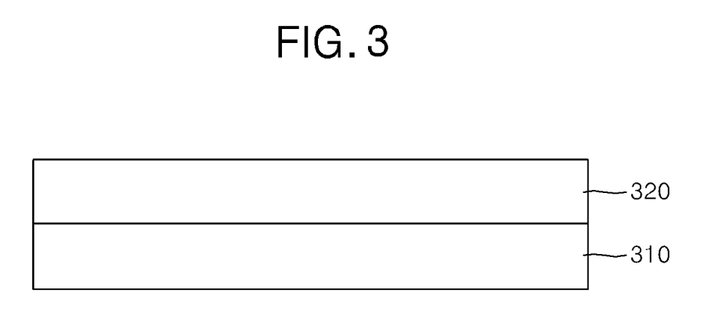
FIGS. 3 through 8 are cross-sectional views illustrating a method of manufacturing a solar cell, according to an embodiment of the present invention.

In the method of manufacturing a solar cell illustrated in FIGS. 3 through 8, first, a lower electrode 310 is formed on a semiconductor substrate 320, as illustrated in FIG. 3. The semiconductor substrate 320 is formed of an n-type or p-type semiconductor material. The semiconductor substrate 320 may be formed of an inorganic or organic material. Available inorganic materials for forming the semiconductor substrate 320 may be at least one selected from the group consisting of Si, Ge, GaAs, GaN, GaP, InAs, InP, InSb, CdSe, CdTe, ZnS, $Al_2O_3$, SiC, glass, and quartz. Available organic materials for forming the semiconductor substrate 320 may be at least one selected from the group consisting of PVP, PMMA, PS, PI, and PET. When the semiconductor substrate 320 is highly doped with an n-type or p-type dopant, the semiconductor substrate 320 may also serve as an electrode. In this regard, the lower electrode 310 may not be formed.

Figure 4:
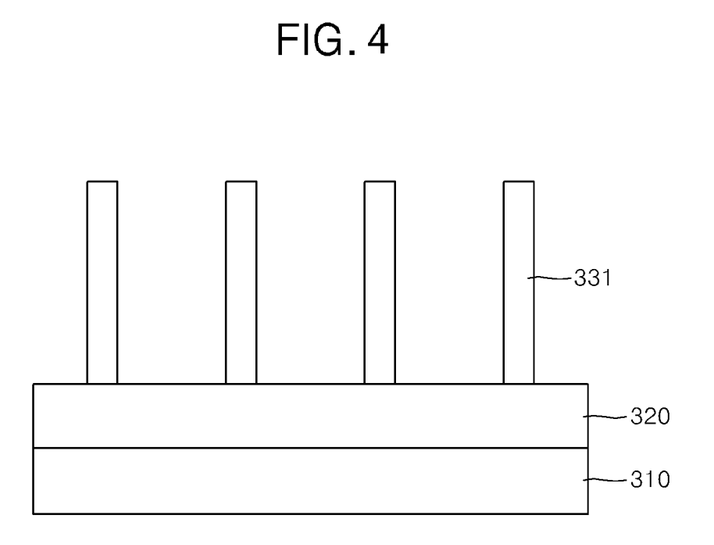

Next, as illustrated in FIG. 4, a plurality of core-nanowires 331 formed of an intrinsic semiconductor material are formed on the semiconductor substrate 320 to be spaced apart from one another at regular intervals. Before the core-nanowires 331 are formed, a natural oxide layer is removed from the semiconductor substrate 320 by using hydrofluoric acid (HF). Available semiconductor materials for forming the core-nanowires 331 may be one selected from the group consisting of Si, Ge, GaAs, GaP, AlSb, InP, $In_2Se_3$, $In_2Te_3$, CdS, CdSe, CdTe, ZnSe, ZnTe, $Bi_2S_3$, $Cu_2S$, $MoSe_2$, $WSe_2$, $SiO_x$, $TiO_2$, $Cu_2O$, CuO, GaN, and ZnO. There may be several methods of forming the core-nanowires 331. In the current embodiment, the core-nanowires 331 are formed using an anodic aluminum oxide (AAO) nanoplate that is formed by anodization or using a metal catalyst. A method of forming the core-nanowires 331 by using the AAO nanoplate that is formed by anodization is illustrated in FIGS. 9A through 9F, FIG. 10, and FIG. 11, and a method of forming the core-nanowires 331 by using a metal catalyst is illustrated in FIGS. 12A through 12C, FIG. 13, and FIG. 14.

FIGS. 9A through 9F are cross-sectional views illustrating a method of forming core-nanowires by using an AAO nanoplate when the method of manufacturing a solar cell illustrated in FIGS. 3 through 8 is performed, according to an embodiment of the present invention.

Figure 9A:
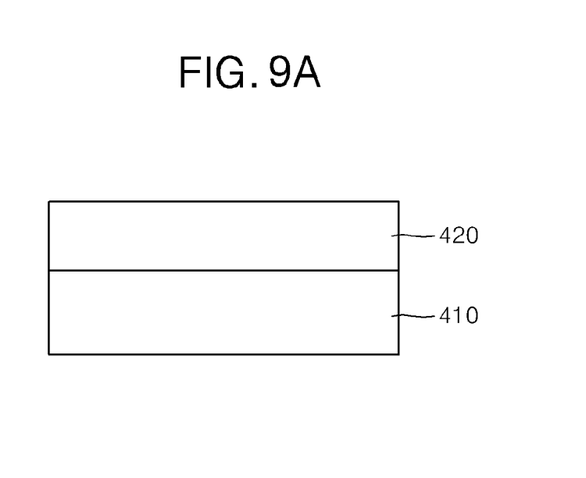
FIGS. 9A through 9F are cross-sectional views illustrating a method of forming core-nanowires by using an anodic aluminum oxide (AAO) nanoplate when the method of manufacturing a solar cell illustrated in FIGS. 3 through 8 is performed, according to an embodiment of the present invention.
Figure 9B:
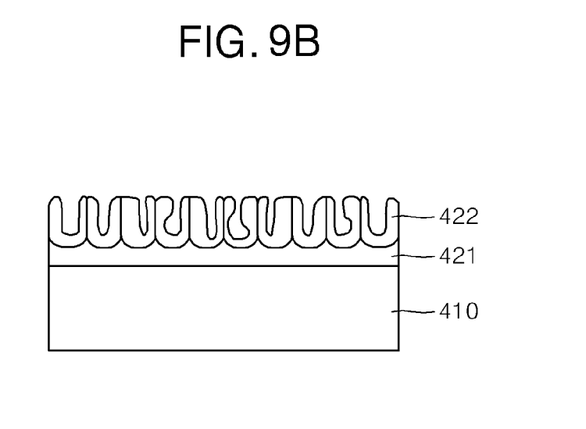

First, as illustrated in FIG. 9A, an aluminum (Al) thin layer 420 having a thickness of several μm, for example, 100 μm, is formed on a substrate 410 by using thermal deposition. In order to perform primary anodization, the substrate 410 on which the Al thin layer 420 is deposited, is connected to an anode, and a platinum or carbon electrode is used as a cathode so that anodization is performed using an electrolyte solution such as sulfuric acid ($H_2SO_4$) or oxalic acid ($H_2O_2O_4$) or for several hours, for example, 4 to 8 hours by applying several voltages, for example, 35V to 55V, to the two electrodes. By adjusting an intensity of voltage, a diameter of a hole that is finally formed of porous alumina may be adjusted, and the temperature of the electrolyte solution may be less than 10° C. Porous alumina 422 is deposited on the surface of the Al thin layer 421 that is primarily anodized, as illustrated in FIG. 9B. However, the porous alumina 422 formed by primary anodization has an irregular shape and a non-uniform height and thus is not suitable for use in the present invention.

Figure 9C:
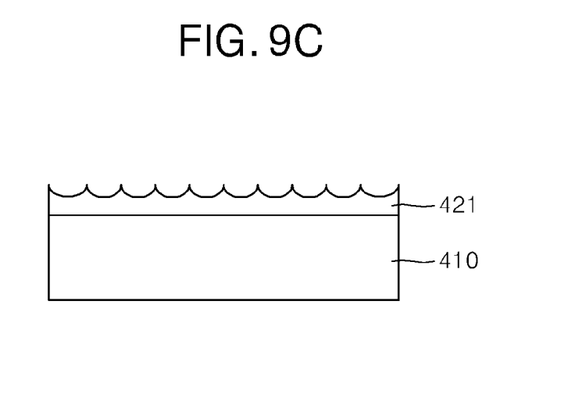

In order to remove the porous alumina 422 having an irregular shape, the substrate 410 is immersed in a solution prepared by mixing phosphoric acid and chromic acid for several hours. For example, the substrate 410 is immersed in a solution which is prepared by mixing 0.4M phosphoric acid and 0.2M chromic acid and of which temperature is 60° C., for 1 to 3 hours, thereby removing the porous alumina 422 from the Al thin layer 421. Very irregular unevenness portions having a small height remain in a position of the Al thin layer 421 from which the porous alumina 422 is removed, on which the porous alumina 422 is deposited, as illustrated in FIG. 9C.

Figure 9D:
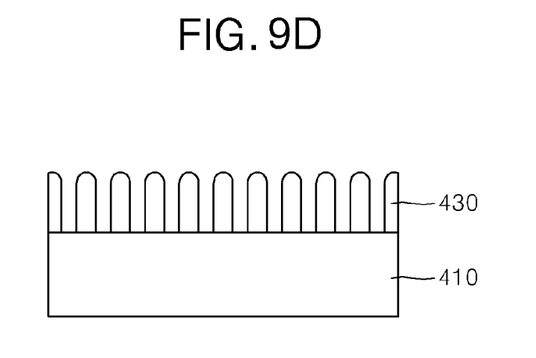

Like in primary anodization, after the substrate 410 is connected to the anode, secondary anodization is performed on the same condition as that of primary anodization for several minutes. For example, secondary anodization is performed in the same electrolyte solution and at the same voltage as those of primary anodization, for 5 to 10 minutes. In this case, porous alumina 430 having a uniform height is formed, as illustrated in FIG. 9D. The height of the porous alumina 430 may be adjusted by adjusting a time for secondary anodization.

Figure 10:
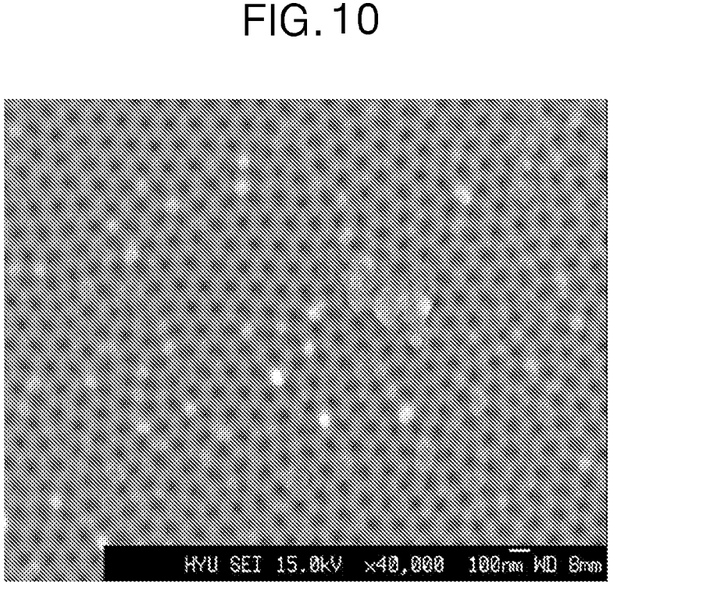
FIG. 10 is a scanning electron microscopy (SEM) photo of an AAO nanoplate that is manufactured by the method illustrated in FIGS. 9A through 9F.
Figure 11:
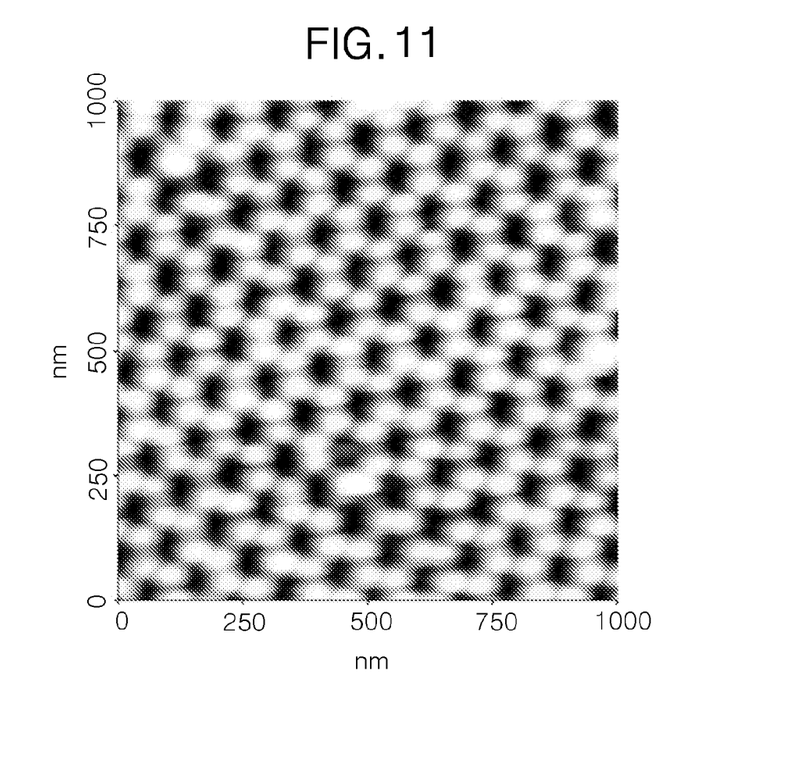
FIG. 11 is an atomic force microscopy (AFM) photo of an AAO nanoplate that is manufactured by the method of FIGS. 9A through 9F.

The porous alumina 430 that is grown by secondary anodization is uniformly distributed on a plane, as shown in a scanning electron microscopy (SEM) photo of FIG. 10. The porous alumina 430 is formed at a uniform height, as shown in an atomic force microscopy (AFM) photo of FIG. 11.

AAO that is formed by anodization has a uniform height, and very irregular unevenness portions are formed in AAO. Thus, AAO may be used for forming a nanoplate. In addition, the size, distance, and height of a hole formed of porous alumina may be easily adjusted according to process conditions and thus, AAO is suitable for use in the present invention.

Figure 9E:
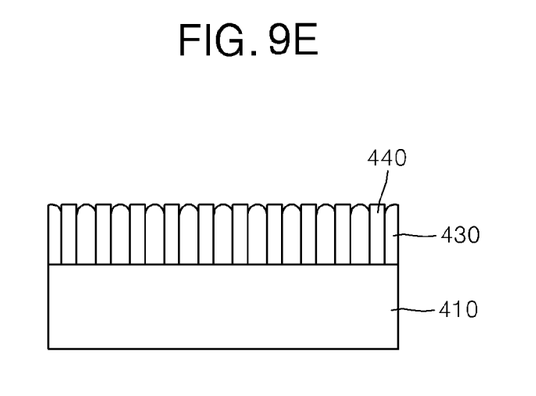
Figure 9F:
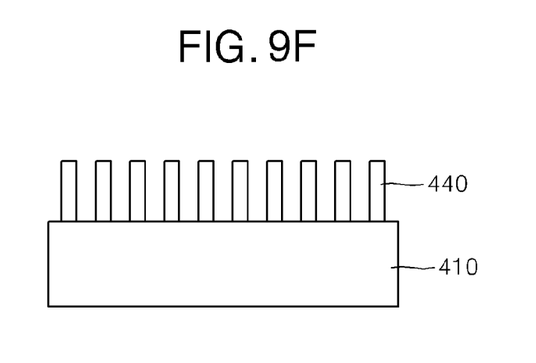

After an intrinsic semiconductor material 440 is deposited on a portion in which the substrate 410 is exposed between the porous alumina 430, as illustrated in FIG. 9E, the porous alumina 430 is removed, as illustrated in FIG. 9F. Thus, a nanowire 440 formed of an intrinsic semiconductor material may be formed on the substrate 410.

Figure 12A:
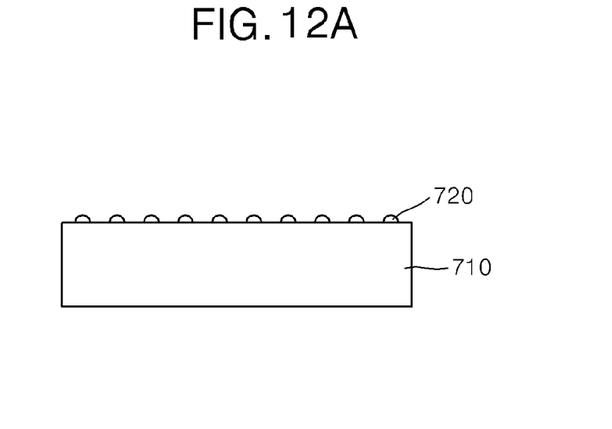
FIGS. 12A through 12C are cross-sectional views illustrating a method of forming core-nanowires by using a metal catalyst when the solar cell illustrated in FIG. 1 is manufactured, according to another embodiment of the present invention.
Figure 12B:
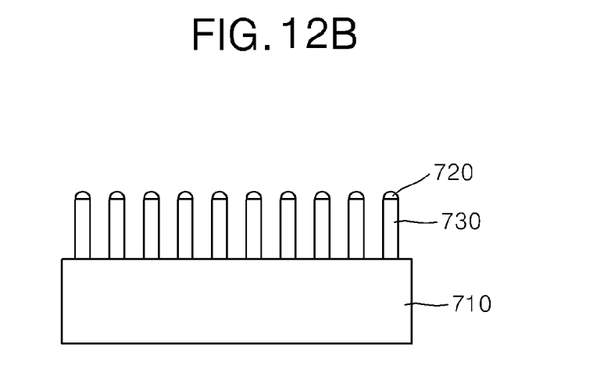
Figure 12C:
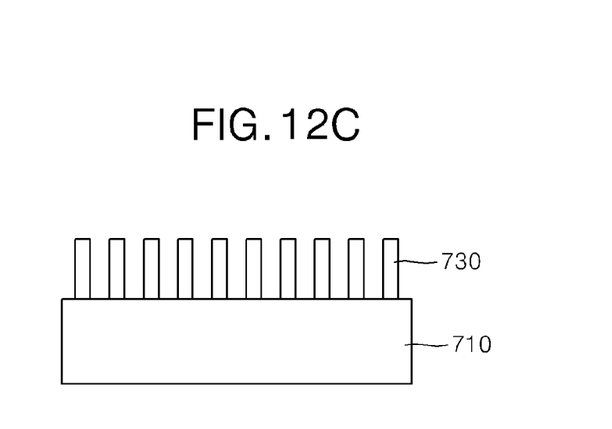

FIGS. 12A through 12C are cross-sectional views illustrating a method of forming core-nanowires by using a metal catalyst when the solar cell 100 illustrated in FIG. 1 is manufactured, according to another embodiment of the present invention.

First, as illustrated in FIG. 12A, a metal catalyst nanodot 720 is formed on a silicon substrate 710. Gold (Au) may be used as a metal catalyst. The metal catalyst nanodot 720 may be formed using two methods. The first method is to coat a colloid solution in which metal catalyst particles having a size of 10 to 30 nm are dispersed, on the substrate 710 and then to anneal the substrate 710 at a temperature of approximately 600° C. to 800° C. The second method is to deposit metal having a thickness of 1 to 2 nm on the substrate 710 by using thermal evaporation and then to anneal the substrate 710 at a temperature of approximately 600° C. to 800° C. In this way, the metal catalyst nanodot 720 is uniformly formed on the substrate 710.

Next, silane ($SiH_4$) that is a silicon precursor is supplied to the substrate 710 on which the metal catalyst nanodot 720 is formed, for 30 to 60 minutes. Then, as illustrated in FIG. 12B, a nanowire 730 formed of intrinsic silicon is formed between the substrate 710 and the metal catalyst nanodot 720 by using a catalyst action of metal.

Figure 13:
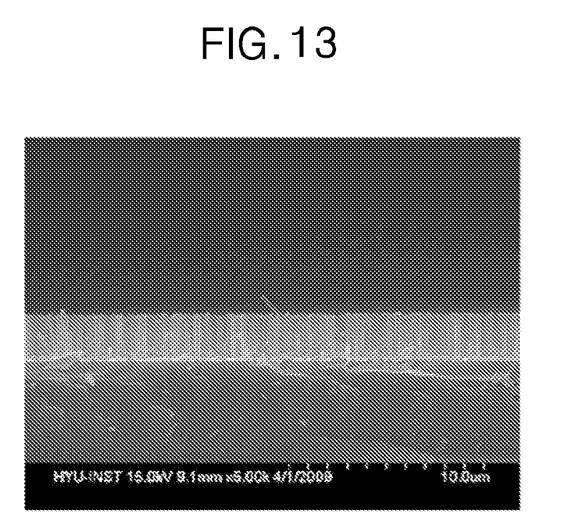
FIGS. 13 and 14 are SEM photos of core-nanowires that are formed by the method illustrated in FIGS. 12A through 12C.
Figure 14:
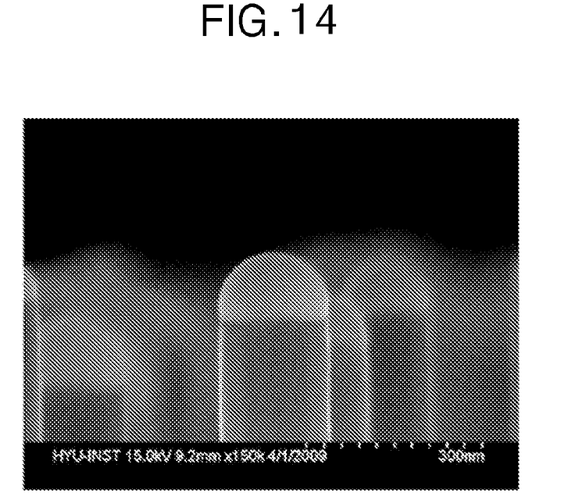

After the nanowire 730 is formed to a desired length, the metal catalyst that exists in an upper portion of the nanowire 730 is etched using an etchant so that the nanowire 730 is formed on the substrate 710 by using an intrinsic semiconductor material, as illustrated in FIG. 12C. SEM photos of core-nanowires formed by the above-described method of FIGS. 12A through 12C are shown in FIGS. 13 and 14.

Figure 5:
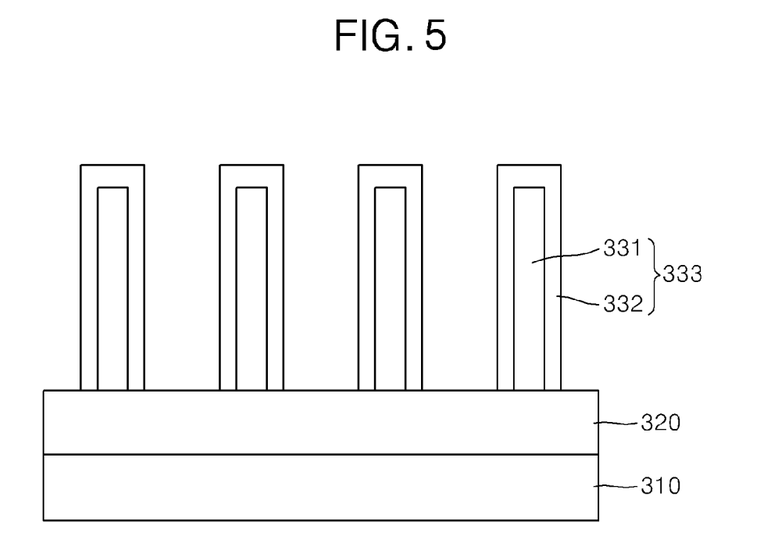

Going back to the method of manufacturing a solar cell according to the present invention, as illustrated in FIG. 5, a shell-nanowire 332 is formed to surround a periphery of each core-nanowire 331. Available semiconductor materials for forming the shell-nanowire 332 may be at least one selected from the group consisting of Si, Ge, GaAs, GaP, AlSb, InP, $In_2Se_3$, $In_2Te_3$, CdS, CdSe, CdTe, ZnSe, ZnTe, $Bi_2S_3$, $Cu_2S$, $MoSe_2$, $WSe_2$, $SiO_x$, $TiO_2$, $Cu_2O$, CuO, GaN, and ZnO. The shell-nanowire 332 may be formed using chemical vapor deposition (CVD), atomic layer deposition (ALD), or the like. A p-type or n-type shell-nanowire 332 is formed by supplying a dopant to the semiconductor substrate 320 together when a raw material gas is supplied to the semiconductor substrate 320. For example, when diborane ($B_2H_6$) that is a p-type dopant is supplied to the semiconductor substrate 320 on which the core-nanowires 331 are formed, together with silane ($SiH_4$) at 500° C. to 550° C., a p-type silicon shell-nanowire may be formed.

Figure 6:
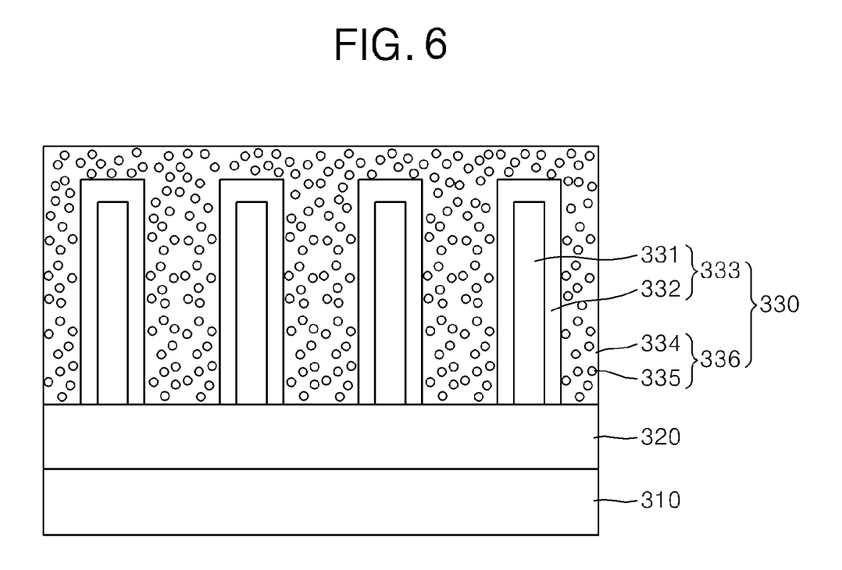

Next, as illustrated in FIG. 6, conductive polymer 334 in which the nanoparticle 334 is dispersed, is formed in an empty space between the semiconductor structures 333 including the core-nanowire 331 and the shell-nanowire 332 by using spin coating so that a photoelectromotive layer 330 is formed. The conductive polymer 334 may be formed of at least one selected from the group consisting of poly(ethylene oxide), polyphosphazene, polyaniline, polypyrrole, polythiophene, poly(p-phenylene), polyacetylene, poly(sulfur nitride), poly(p-phenylenevinylene), and poly(N-vinyl-carbazole). The nanoparticle 335 may be formed of at least one selected from the group consisting of $Al_2O_3$, $BaCO_3$, $Bi_2O_3$, $B_2O_3$, $CaCO_3$, $CeO_2$, $Cr_2O_3$, $Fe_2O_3$, $Ga_2O_3$, $In_2O_3$, $Li_2CO_3$, $LiCoO_2$, MgO, $MnCO_3$, $MnO_2$, $Mn_3O_4$, $Nb_2O_5$, PbO, $Sb_2O_3$, $SnO_2$, $SrCO_3$, $Ta_2O_5$, $TiO_2$, $BaTiO_3$, $V_2O_5$, $WO_3$, and $ZrO_2$.

Figure 7:
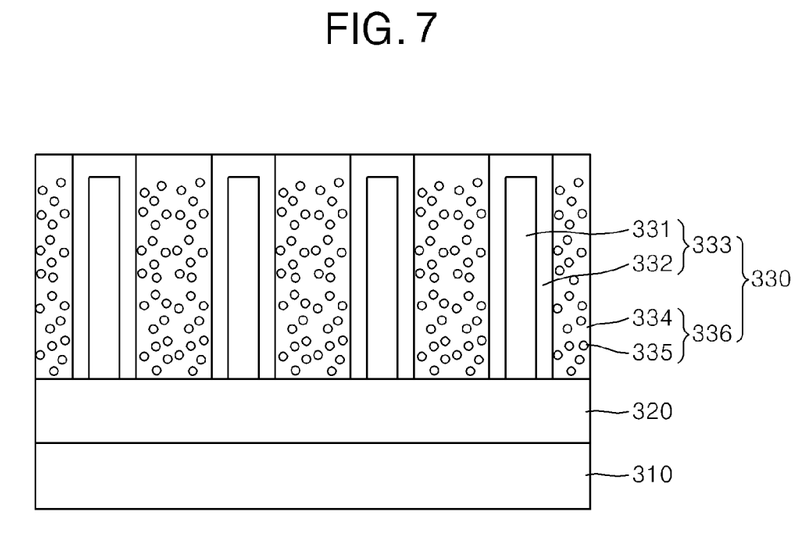

As illustrated in FIG. 7, a portion of the surface of an organic structure 336 including the conductive polymer 334 and the nanoparticle 335 is removed so that a top surface of the semiconductor structure 333 is exposed. This is because excess carriers such as holes that are moved from the semiconductor structure 333 to an upper electrode 340 may be moved directly to an upper electrode 340 without passing through the conductive polymer 334. As such, a reduction in mobility of the excess carriers is prevented, and light generation efficiency is increased. The organic structure 336 is removed using an ashing process.

Figure 8:
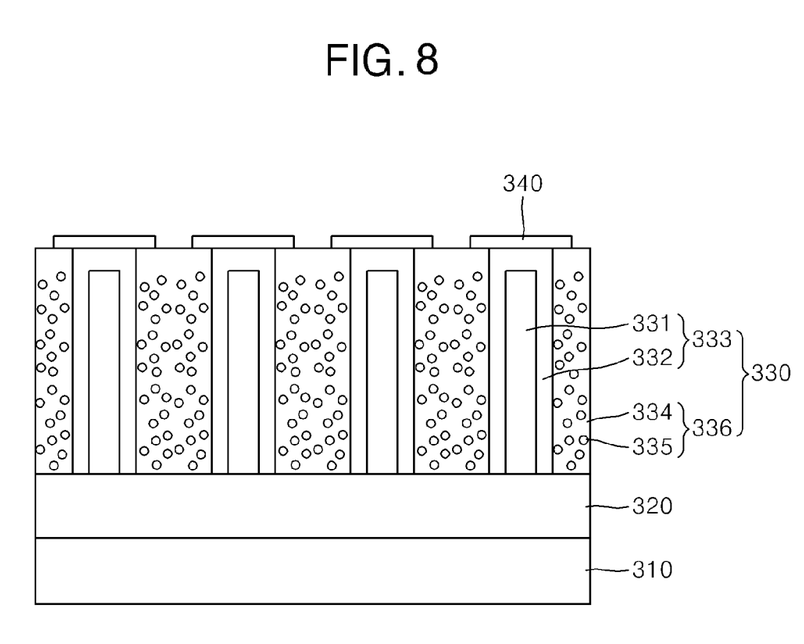

Next, as illustrated in FIG. 8, the upper electrode 340 is formed on the photoelectromotive layer 330. The upper electrode 340 may be formed of a conductive material having permeability so that more solar light may be incident on an inside of the photoelectromotive layer 330. To this end, the upper electrode 370 may be formed of at least one selected from the group consisting of graphene, CNT, indium tin oxide (ITO), Al-doped ZnO (AZO), Ga-doped ZnO (GZO), In-doped ZnO (IZO), Au, Pt, and Ti. The upper electrode 340 may be patterned to cover the entire top surface of the semiconductor structure 333 and a portion of a top surface of the organic structure 336, as illustrated in FIG. 8.

As described above, when a solar cell is manufactured by using the above-described method, the solar cell may be manufactured by using an inorganic material and an organic material that are inexpensive, and a process of manufacturing the solar cell may be simplified, and manufacturing cost may be reduced, and a large-scaled solar cell may be manufactured.

While the present invention has been particularly shown and described with reference to exemplary embodiments thereof, it will be understood by those of ordinary skill in the art that various changes in form and details may be made therein without departing from the spirit and scope of the present invention as defined by the following to claims.

The invention claimed is:

1. A solar cell comprising:
   a semiconductor layer formed of a semiconductor material; and
   a photoelectromotive layer comprising a semiconductor structure comprising a core-nanowire that extends long in an upward direction of the semiconductor layer and is formed of an intrinsic semiconductor material, and a shell-nanowire that is formed to surround a periphery of the core-nanowire and is formed of a semiconductor material, wherein the semiconductor material that is used for forming the semiconductor layer comprises an n-type semiconductor material, and the semiconductor material that is used for forming the shell-nanowire comprises a p-type semiconductor material, or the semiconductor material that is used for forming the semiconductor layer comprises a p-type semiconductor material, and the semiconductor material that is used for forming the shell-nanowire comprises an n-type semiconductor material.

2. The solar cell of claim 1, wherein the photoelectromotive layer further comprises an organic structure comprising conductive polymer that is deposited on the semiconductor layer to surround a lateral portion of the semiconductor structure.

3. The solar cell of claim 2, wherein the conductive polymer comprises at least one selected from the group consisting of poly(ethylene oxide), polyphosphazene, polyaniline, polypyrrole, polythiophene, poly(p-phenylene), polyacetylene, poly(sulfur nitride), poly(p-phenylenevinylene), and poly(N-vinyl-carbazole).

4. The solar cell of claim 2, wherein the organic structure further comprises a nanoparticle that is dispersed into the conductive polymer.

5. The solar cell of claim 2, wherein the organic structure further comprises a carbon nanotube (CNT) comprising the nanoparticle dispersed into the conductive polymer, attached to the carbon nanotube (CNT).

6. The solar cell of claim 4, wherein the carbon nanotube (CNT) comprises at least one selected from the group consisting of a singe wall carbon nanotube (SWCNT), a double wall CNT (DWCNT), a multi-wall CNT (MWCNT), and a carbon nanotube bundle.

7. The solar cell of claim 4, wherein the nanoparticle comprises at least one selected from the group consisting of $Al_2O_3$, $BaCO_3$, $Bi_2O_3$, $B_2O_3$, $CaCO_3$, $CeO_2$, $Cr_2O_3$, $Fe_2O_3$, $Ga_2O_3$, $In_2O_3$, $Li_2CO_3$, $LiCoO_2$, $MgO$, $MnCO_3$, $MnO_2$, $Mn_3O_4$, $Nb_2O_5$, $PbO$, $Sb_2O_3$, $SnO_2$, $SrCO_3$, $Ta_2O_5$, $TiO_2$, $BaTiO_3$, $V_2O_5$, $WO_3$, and $ZrO_2$.

8. The solar cell of claim 4, wherein a bandgap of the nanoparticle is greater than a bandgap of the intrinsic semiconductor material.

9. The solar cell of claim 1, wherein the semiconductor layer comprises a semiconductor substrate, and the semiconductor substrate comprises an inorganic material.

10. The solar cell of claim 9, wherein an inorganic material that is used for forming the semiconductor substrate comprises at least one selected from the group consisting of Si, Ge, GaAs, GaN, GaP, InAs, InP, InSb, CdSe, CdTe, ZnS, $Al_2O_3$, SiC, glass, and quartz.

11. The solar cell of claim 1, wherein the semiconductor material that is used for forming the core-nanowire and the shell-nanowire comprises at least one selected from the group consisting of Si, Ge, GaAs, GaP, AlSb, InP, $In_2Se_3$, $In_2Te_3$, CdS, CdSe, CdTe, ZnSe, ZnTe, $Bi_2S_3$, $Cu_2S$, $MoSe_2$, $WSe_2$, $SiO_x$, $TiO_2$, $Cu_2O$, CuO, GaN, and ZnO.

12. The solar cell of claim 2, further comprising:
   a lower electrode formed in a lower portion of the semiconductor layer; and
   an upper electrode formed on the photoelectromotive layer.

13. The solar cell of claim 12, wherein the upper electrode is formed to cover an entire top surface of the semiconductor structure and a portion of a top surface of the organic structure.

14. The solar cell of claim 12, wherein the upper electrode comprises a conductive material having permeability.

15. The solar cell of claim 14, wherein the conductive material comprises at least one selected from the group consisting of graphene, CNT, indium tin oxide (ITO), Al-doped ZnO (AZO), Ga-doped ZnO (GZO), In-doped ZnO (IZO), Au, Pt, and Ti.

16. The solar cell of claim 1, wherein the core-nanowire is vertically grown on the semiconductor layer by using an anodic aluminium oxide (AAO) nanoplate that is formed by anodization.

17. The solar cell of claim 1, wherein the core-nanowire is vertically grown on the semiconductor layer by using a metal catalyst.

* * * * *